(12) United States Patent
Tsai

(10) Patent No.: US 11,451,150 B2
(45) Date of Patent: Sep. 20, 2022

(54) VOLTAGE CONVERTER CAPABLE OF ADAPTIVELY OPERATING IN ONE OF SYNCHRONOUS MODE AND ASYNCHRONOUS MODE

(71) Applicant: REALTEK SEMICONDUCTOR CORPORATION, Hsinchu (TW)

(72) Inventor: Tsung-Yen Tsai, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 326 days.

(21) Appl. No.: 16/821,545

(22) Filed: Mar. 17, 2020

(65) Prior Publication Data
US 2020/0321870 A1 Oct. 8, 2020

(30) Foreign Application Priority Data
Apr. 2, 2019 (TW) .................................. 108111623

(51) Int. Cl.
*H02M 3/158* (2006.01)
*H03K 7/06* (2006.01)
(Continued)

(52) U.S. Cl.
CPC ........... *H02M 3/1582* (2013.01); *H02M 3/07* (2013.01); *H03K 7/06* (2013.01); *H03K 7/08* (2013.01)

(58) Field of Classification Search
CPC ..... G05F 1/00; G05F 1/10; G05F 1/12; G05F 1/46; G05F 1/1455; G05F 1/45;
(Continued)

(56) References Cited

U.S. PATENT DOCUMENTS

| 4,578,630 A | 3/1986 | Grosch | |
| 7,164,591 B2 * | 1/2007 | Soldano | H02M 1/4225 |
| | | | 363/89 |

(Continued)

FOREIGN PATENT DOCUMENTS

| CN | 107735932 A | 2/2018 | |
| TW | 201404023 A | 1/2014 | |
| WO | WO-2005033819 A2 * | 4/2005 | .......... H02M 1/4225 |

OTHER PUBLICATIONS

OA letter of the counterpart TW application (appl. No. 108111623) mailed on Oct. 15, 2019. Summary of the OA letter: Claims 1, 5, and 6 are rejected as being anticipated by the cited reference 1 (TW 201404023 A, also published as US2014015503A1). Claims 7, 9, and 10 are rejected as being unpatentable over the cited reference 1 (TW 201404023 A, also published as US2014015503A1) in view of the common knowledge of this technical field.

(Continued)

*Primary Examiner* — Thienvu V Tran
*Assistant Examiner* — Nusrat Quddus
(74) *Attorney, Agent, or Firm* — WPAT, PC

(57) ABSTRACT

Disclosed is a voltage converter capable of adaptively operating in one of a synchronous mode and an asynchronous mode according to an input voltage of an input terminal. The voltage converter includes: a voltage detector generating a detection result according to the input voltage; a switch control circuit generating a first switch control signal and a second switch control signal according to the detection result and an output voltage of an output terminal; a first switch intermittently turned on according to the first switch control signal in the synchronous and asynchronous modes; a second switch intermittently turned on/off according to the second switch control signal in the synchronous/asynchronous mode; and an energy storage circuit electri- (Continued)

cally connected to the input and output terminals to store and release energy according to the on-off states of the first and second switches.

14 Claims, 4 Drawing Sheets

(51) Int. Cl.
*H03K 7/08* (2006.01)
*H02M 3/07* (2006.01)

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H05B 39/048; B23K 11/24; H04B 2215/069; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17
See application file for complete search history.

(56) References Cited

U.S. PATENT DOCUMENTS

| | | | |
|---|---|---|---|
| 7,586,767 B1* | 9/2009 | Prodic | H02M 3/158 700/297 |
| 8,274,266 B2* | 9/2012 | Engelhardt | H02M 3/1582 323/259 |
| 9,577,520 B2* | 2/2017 | Xiu | H02M 3/156 |
| 2006/0198172 A1* | 9/2006 | Wood | H02M 1/4233 363/89 |
| 2007/0176588 A1* | 8/2007 | Nishida | H02M 3/158 323/284 |
| 2008/0002444 A1* | 1/2008 | Shekhawat | H02M 1/34 363/127 |
| 2012/0243275 A1* | 9/2012 | Lin | H02M 1/4208 363/89 |
| 2013/0069613 A1* | 3/2013 | Nakase | H02M 3/156 323/284 |
| 2014/0015503 A1 | 1/2014 | Cheng | |
| 2014/0253086 A1* | 9/2014 | Rosu-Hamzescu | H02M 3/337 323/311 |
| 2015/0146458 A1* | 5/2015 | Lim | H02M 3/158 363/44 |
| 2017/0012526 A1 | 1/2017 | Chen | |
| 2017/0250605 A1* | 8/2017 | Park | G09G 3/3266 |

OTHER PUBLICATIONS

OA letter ol the counterpart UN application (appl. No. 201910285612.2) mailed on Apr. 9, 2021. Summary of the OA letter: Claims 1-8, 10 are rejected as being anticipated by the cited reference 1 (CN107735932A, also published as US20170012526A1). Claim 9 is rejected as being unpatentable over the cited reference 1 in view of the common knowledge of this technical field.

* cited by examiner

VOLTAGE CONVERTER CAPABLE OF ADAPTIVELY OPERATING IN ONE OF SYNCHRONOUS MODE AND ASYNCHRONOUS MODE

BACKGROUND OF THE INVENTION

1. Field of the Invention

The present disclosure relates to a voltage converter, especially to a voltage converter capable of adaptively operating in one of a synchronous mode and an asynchronous mode.

2. Description of Related Art

A voltage converter such as the voltage converter disclosed in the US patent of U.S. Pat. No. 4,578,630 is a common circuit in this technical field. The types of general voltage converters include a synchronous type and an asynchronous type. The conversion efficiency of a synchronous-type voltage converter is usually better than the conversion efficiency of an asynchronous-type voltage converter. However, although the conversion efficiency of a synchronous-type voltage converter is better, in some applications a synchronous-type voltage converter may have other problems. For instance, regarding a synchronous-type buck converter of a radio-frequency device, when the input voltage (e.g., 1.7V normally) and the output voltage (e.g., 1.1V normally) of the synchronous-type buck converter become close, the input voltage may interfere with radio-frequency signals, which may cause the phase noise of the radio-frequency signals to get worse.

In light of the above, what is desired is a voltage converter to prevent conversion efficiency from degenerating and to mitigate the influence caused by an insufficient gap between an input voltage and an output voltage.

SUMMARY OF THE INVENTION

An object of the present disclosure is to disclose a voltage converter capable of preventing the problems of the prior art.

An embodiment of the voltage converter of the present disclosure is capable of adaptively operating in one of a synchronous mode and an asynchronous mode. This embodiment includes a voltage detector, a switch control circuit, a first switch, a second switch, and an energy storage circuit. The voltage detector is configured to generate a detection result according to the input voltage of an input terminal. The switch control circuit is configured to generate a first switch control signal and a second switch control signal according to the detection result and the output voltage of an output terminal. The first switch is configured to be intermittently turned on according to the first switch control signal in both the synchronous mode and the asynchronous mode. The second switch is configured to be intermittently turned on according to the second switch control signal in the synchronous mode and to be turned off according to the second switch control signal in the asynchronous mode, wherein the first switch and the second switch are not turned on simultaneously. The energy storage circuit is electrically connected to the input terminal and the output terminal, and is configured to store and release energy according to the on-off states of the first switch and the second switch and thereby adjust the output voltage according to the input voltage. Accordingly, in the circumstance that the input voltage and the output voltage are not close, the voltage converter of the present disclosure can operate in the synchronous mode to ensure better conversion efficiency; and in the circumstance that the input voltage and the output voltage are close, the voltage converter of the present disclosure can operate in the asynchronous mode to mitigate the influence caused by an insufficient gap between the input voltage and the output voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure discloses a voltage converter capable of adaptively operating in one of a synchronous mode and an asynchronous mode according to an input voltage; in other words, in the synchronous mode the voltage converter functions as a synchronous-type voltage converter, and in the asynchronous mode the voltage converter functions as an asynchronous-type voltage converter. Accordingly, when the input voltage is not close to an output voltage, the voltage converter can operate in the synchronous mode to ensure better conversion efficiency; and when the input voltage approximates to the output voltage, the voltage converter can operate in the asynchronous mode to mitigate the influence caused by an insufficient gap between the input voltage and the output voltage.

Figure 1:
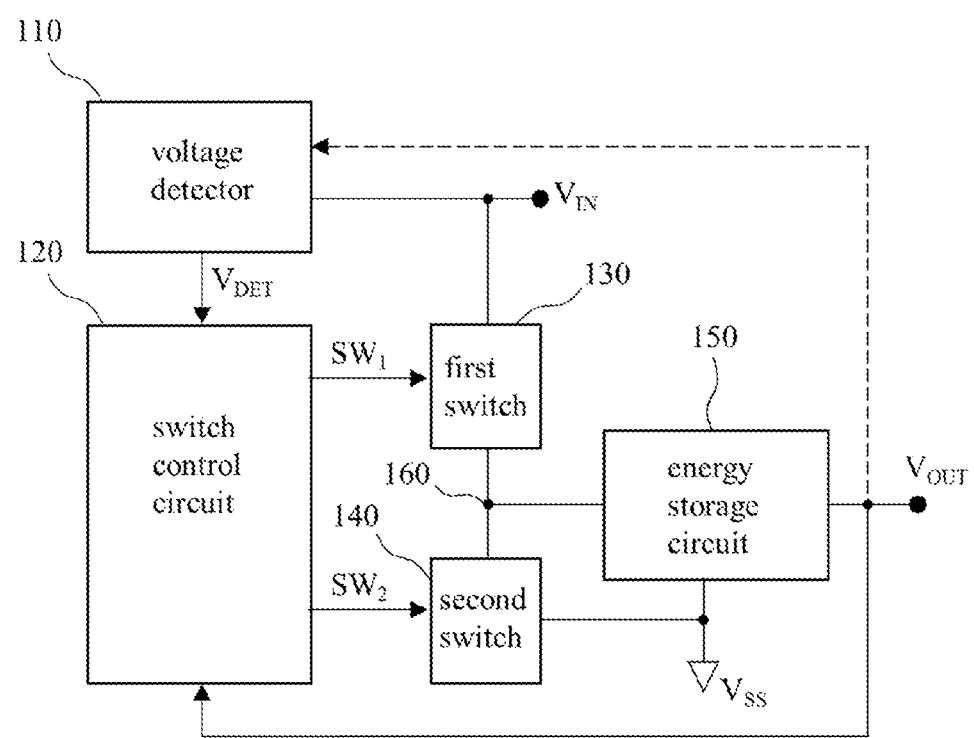
FIG. 1 shows an embodiment of the voltage converter of the present disclosure.

FIG. 1 shows an embodiment of the voltage converter of the present disclosure. The voltage converter 100 of FIG. 1 is a buck converter converting a high voltage into a low voltage; the voltage converter 100 includes a voltage detector 110, a switch control circuit 120, a first switch 130, a second switch 140, and an energy storage circuit 150. The voltage converter 100 is an integrated circuit (IC), but the scope of the present invention is not limited thereto. In addition, the dashed line of FIG. 1 stands for an optional path which could remain or be removed according to the requirements for implementation.

Please refer to FIG. 1. The voltage detector 110 is configured to generate a detection result $V_{DET}$ according to the input voltage $V_{IN}$ of an input terminal. For instance, in a circumstance that the voltage detector 110 determines that the absolute value of the difference between the input voltage $V_{IN}$ and the below-mentioned output voltage $V_{OUT}$ is lower than a threshold (e.g., 0.5V), the voltage detector 110 outputs the detection result $V_{DET}$ to have the switch control circuit 120 generate a first switch control signal $SW_1$ and a second switch control signal $SW_2$ suitable for an asynchronous mode; and in another circumstance that the voltage detector 110 determines that the absolute value of the difference between the input voltage $V_{IN}$ and the output voltage $V_{OUT}$ is not lower than the threshold, the voltage detector 110 outputs the detection result $V_{DET}$ to have the switch control circuit 120 generate the first switch control signal $SW_1$ and the second switch control signal $SW_2$ suitable for a synchronous mode; additionally, if the output voltage $V_{OUT}$ needs to approximate to a predetermined voltage (e.g., 1.1V), which implies that the output voltage $V_{OUT}$ should be gradually adjusted to be equal to or close to the predetermined voltage, the voltage detector 110 can find out the relation between the input voltage $V_{IN}$ and the output voltage $V_{OUT}$ (e.g., find out whether the absolute value of the difference between the input voltage $V_{IN}$ and the output voltage $V_{OUT}$ is lower than the threshold) according to the setting of the predetermined voltage and the input voltage $V_{IN}$, wherein the threshold can be set in accordance with the requirements for implementation.

In an exemplary implementation, the voltage detector 110 is an N-bit analog-to-digital converter (ADC), the N is an integer greater than one, and the N-bit ADC outputs a digital value as the detection result $V_{DET}$ according to the relation between the input voltage $V_{IN}$ and the output voltage $V_{OUT}$, wherein the digital value is positively/inversely proportional to the difference between the input voltage $V_{IN}$ and the output voltage $V_{OUT}$. In another exemplary implementation, the voltage detector 110 is a voltage comparator that is used to compare the input voltage $V_{IN}$ with a reference voltage (e.g., the predetermined voltage plus/minus the threshold) and thereby generate a comparison result as the detection result $V_{DET}$. Since each of the N-bit ADC and the voltage comparator is a known or self-developed circuit, their detail is omitted here.

Please refer to FIG. 1. The switch control circuit 120 is configured to generate a first switch control signal $SW_1$ and a second switch control signal $SW_2$ according to the detection result $V_{DET}$ of the voltage detector 110 and the output voltage $V_{OUT}$ of the output terminal. In detail, according to the detection result $V_{DET}$, the switch control circuit 120 can control the first switch 130 and the second switch 140 by the first switch control signal $SW_1$ and the second switch control signal $SW_2$ respectively to have the two switches operate in one of the synchronous mode and the asynchronous mode; furthermore, according to the output voltage $V_{OUT}$, the switch control circuit 120 can control the first switch 130 and the second switch 140 by the first switch control signal $SW_1$ and the second switch control signal $SW_2$ respectively to have the output voltage $V_{OUT}$ approximate to a desired voltage. It should be noted that under the control of the switch control circuit 120, the first switch 130 and the second switch 140 will not be turned on simultaneously.

In an exemplary implementation, the switch control circuit 120 executes at least one of a pulse width modulation (PWM) and a pulse frequency modulation (PFM) so as to control the on-off states of the first switch 130 and the second switch 140. Since the switch control circuit 120 alone is a known or self-developed circuit (e.g., a PWM circuit and/or a PFM circuit), its detail is omitted here.

Please refer to FIG. 1. The first switch 130 is set between the input terminal of the input voltage $V_{IN}$ and a node 160, and the second switch 140 is set between the node 160 and a low-voltage terminal (e.g., a ground terminal) of a low voltage $V_{SS}$. The first switch 130 is configured to be intermittently turned on according to the first switch control signal $SW_1$ in both the synchronous mode and the asynchronous mode and thereby adjust the output voltage $V_{OUT}$. The second switch 140 is configured to be intermittently turned on according to the second switch control signal $SW_2$ in the synchronous mode and thereby adjust the output voltage $V_{OUT}$; in this circumstance, the voltage converter 100 functions as a synchronous-type voltage converter having better conversion efficiency. The second switch 140 is also configured to be turned off according to the second switch control signal $SW_2$ in the asynchronous mode; in this circumstance, the voltage converter 100 functions as an asynchronous-type voltage converter capable of mitigating the influence caused by an insufficient gap between the input voltage $V_{IN}$ and the output voltage $V_{OUT}$. In an exemplary implementation, each of the first switch 130 and the second switch 140 is/includes a transistor; the gate of the transistor of the first/second switch 130/140 is used to receive the first/second switch control signal $SW_1/SW_2$; the second switch 140 includes a parasitic diode which functions as a current path conducting current in the asynchronous mode so that the second switch 140 is equivalent to a diode in the asynchronous mode.

In another exemplary implementation, the first switch 130 is/includes a first-type transistor (e.g., a PMOS transistor) while the second switch 140 is/includes a second-type transistor (e.g., an NMOS transistor). Since each of the first switch 130 and the second switch 140 alone is a known or self-developed circuit, their detail is omitted here.

Figure 2:
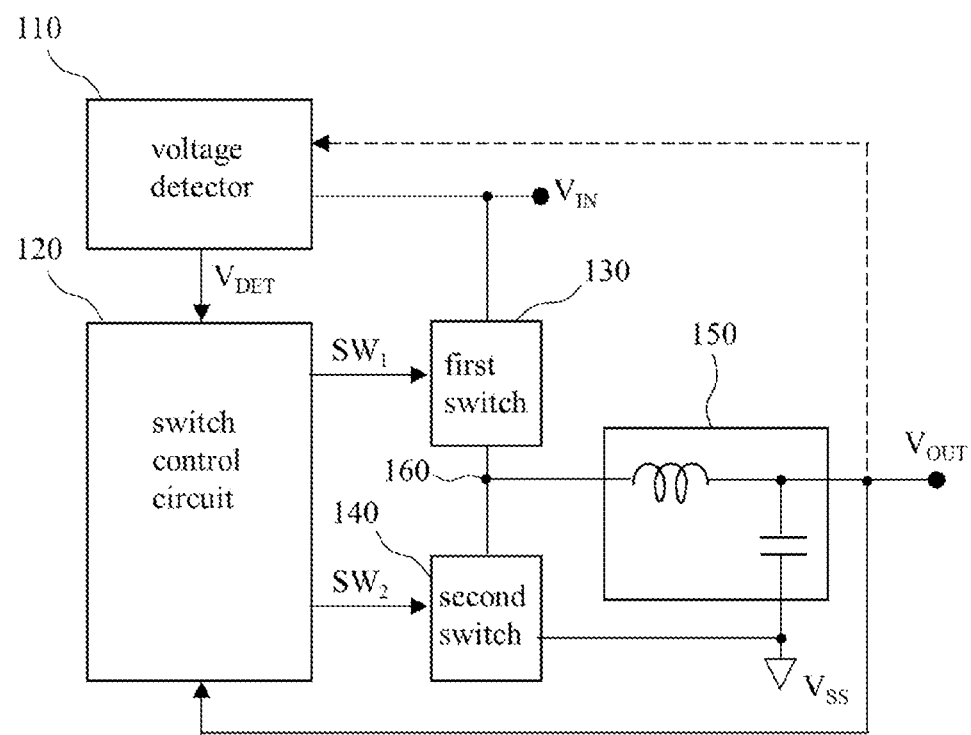
FIG. 2 shows an embodiment of the energy storage circuit of FIG. 1.

Please refer to FIG. 1. The energy storage circuit 150 is electrically connected to the input terminal of the input voltage $V_{IN}$ and the output terminal of the output voltage $V_{OUT}$, and is configured to store and release energy according to the on-off states of the first switch 130 and the second switch 140; consequently, the energy storage circuit 150 can adjust the output voltage $V_{OUT}$ with the energy of the input voltage $V_{IN}$. An embodiment of the energy storage circuit 150 is shown in FIG. 2. The embodiment of FIG. 2 includes an inductor and a capacitor; the inductor is set between the node 160 and the output terminal of the output voltage $V_{OUT}$; and the capacitor is set between the output terminal of the output voltage $V_{OUT}$ and the low-voltage terminal of the low voltage $V_{SS}$. Since each of the inductor and the capacitor alone is a known or self-developed circuit, their detail is omitted here.

Figure 3:
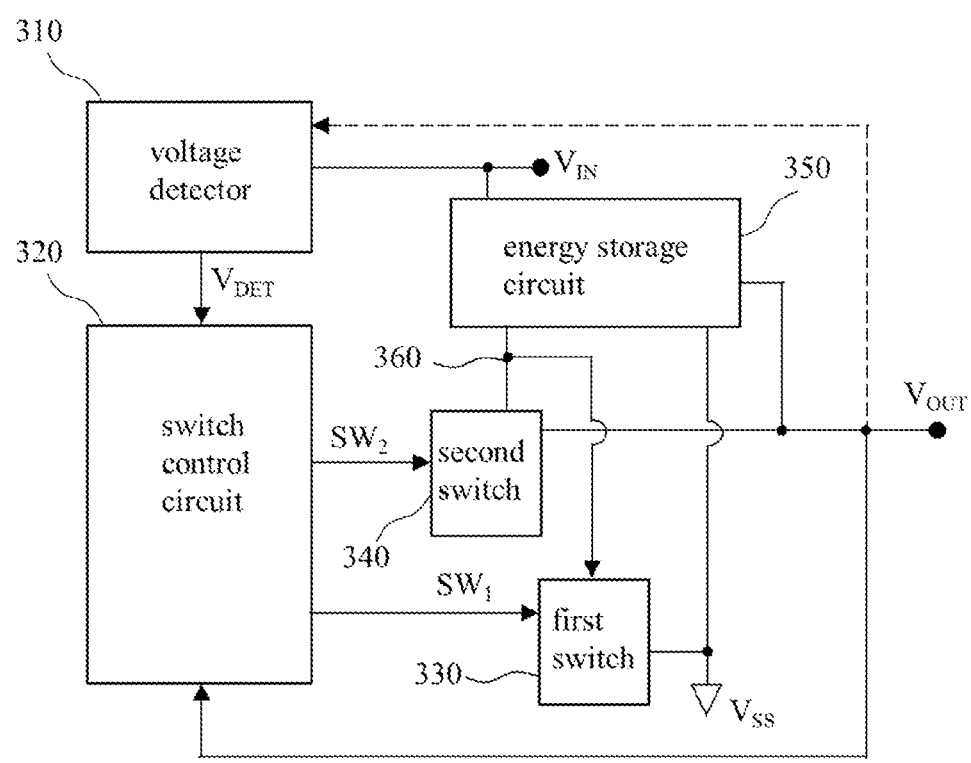
FIG. 3 shows another embodiment of the voltage converter of the present disclosure.

FIG. 3 shows another embodiment of the voltage converter of the present disclosure. The voltage converter 300 of FIG. 3 is a boost converter converting a low voltage into a high voltage; the voltage converter 300 includes a voltage detector 310, a switch control circuit 320, a first switch 330, a second switch 340, and an energy storage circuit 350. The voltage converter 300 of FIG. 3 is an IC, but the scope of the present invention is not limited thereto. In addition, the dashed line of FIG. 3 stands for an optional path which could remain or be removed according to the requirements for implementation.

Please refer to FIG. 3. The voltage detector 310, the switch control circuit 320, the first switch 330, and the second switch 340 of FIG. 3 are identical/similar to the voltage detector 110, the switch control circuit 120, the first switch 130, and the second switch 140 of FIG. 1 respectively. As to these circuits, the major difference between FIG. 1 and FIG. 3 is that the input voltage $V_{IN}$ is higher than the output voltage $V_{OUT}$ in FIG. 1 but the input voltage $V_{IN}$ is lower than the output voltage $V_{OUT}$ in FIG. 3; accordingly, each of the voltage detector 110 of FIG. 1 and the voltage detector 310 of FIG. 3 determines the relation between the input voltage $V_{IN}$ and the output voltage $V_{OUT}$ according to their respective voltage conditions (e.g., determines whether the absolute value of the difference between the input voltage $V_{IN}$ and the output voltage $V_{OUT}$ is lower than a threshold); in addition, compared with FIG. 1, the first switch 330 of FIG. 3 is set between a node 360 and a low-voltage terminal of a low voltage $V_{SS}$, and the second switch 340 of FIG. 3 is set between the node 360 and the output terminal of the output voltage $V_{OUT}$.

Figure 4:
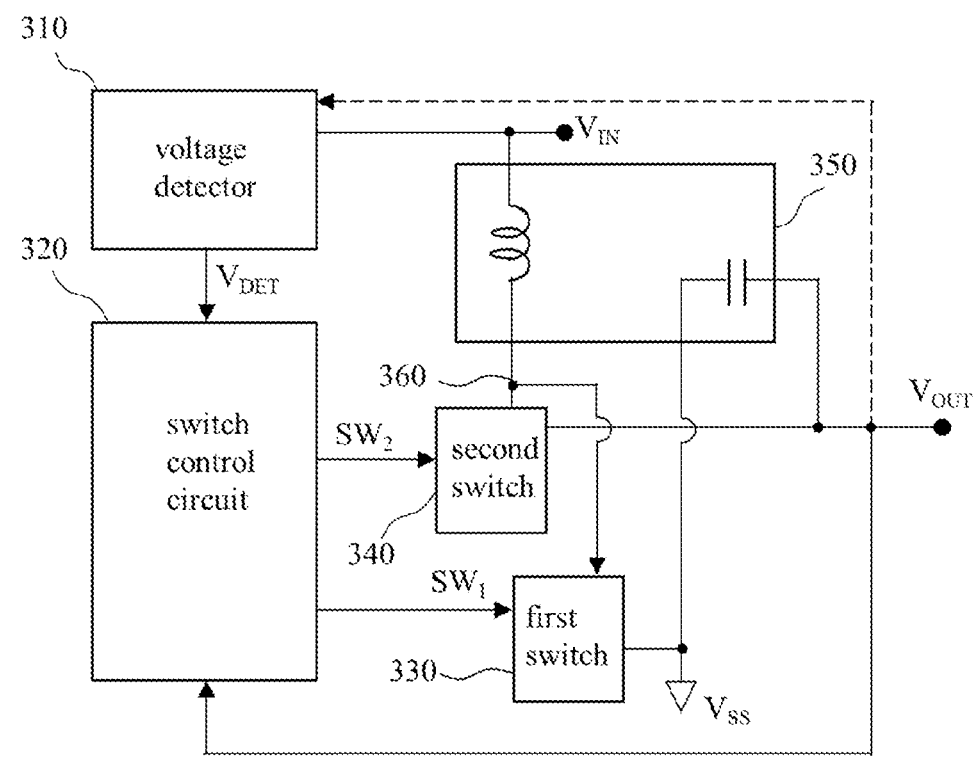
FIG. 4 shows an embodiment of the energy storage circuit of FIG. 3.

Please refer to FIG. 3. The energy storage circuit 350 is electrically connected with the input terminal of the input voltage $V_{IN}$ and the output terminal of the output voltage $V_{OUT}$, and is configured to store and release energy according to the on-off states of the first switch 330 and the second switch 340; consequently, the energy storage circuit 350 can adjust the output voltage $V_{OUT}$ with the energy of the input voltage $V_{IN}$. An embodiment of the energy storage circuit 350 is shown in FIG. 4. The embodiment of FIG. 4 includes an inductor and a capacitor; the inductor is set between the input terminal of the input voltage $V_{IN}$ and the node 360; the capacitor is set between the output terminal of the output voltage $V_{OUT}$ and the low-voltage terminal of the low voltage $V_{SS}$. Since each of the inductor and the capacitor alone is a known or self-developed circuit, their detail is omitted here.

Since those of ordinary skill in the art can appreciate the detail and modification of the embodiment of FIG. 3 by referring to the disclosure of the embodiment of FIG. 1, which implies that some or all of the features of the embodiment of FIG. 1 can be applied to the embodiment of FIG. 3 in a reasonable way, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the voltage converter of the present disclosure can operate in the synchronous mode to ensure better conversion efficiency when the input voltage is not close to the output voltage; and the voltage converter can operate in the asynchronous mode to mitigate the influence caused by an insufficient gap between the input voltage and the output voltage when the input voltage approximates to the output voltage.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A voltage converter capable of operating in one of a synchronous mode and an asynchronous mode according to an input voltage of an input terminal, the voltage converter comprising:
a voltage detector configured to generate a detection result according to the input voltage of the input terminal;
a switch control circuit configured to receive the detection result and an output voltage of an output terminal and thereby generate a first switch control signal and a second switch control signal;
a first switch configured to be intermittently turned on according to the first switch control signal in the synchronous mode and the asynchronous mode;
a second switch configured to be intermittently turned on according to the second switch control signal in the synchronous mode and to be turned off according to the second switch control signal in the asynchronous mode, wherein the first switch and the second switch are different kinds of transistors and are not turned on simultaneously, and the output voltage is adjusted without using the second switch in the asynchronous mode; and
an energy storage circuit electrically connected to the input terminal and the output terminal, and the energy storage circuit configured to store and release energy according to on-off states of the first switch and the second switch and thereby adjust the output voltage according to the input voltage.

2. The voltage converter of claim 1, wherein in a first circumstance that the voltage detector determines that a difference between the input voltage and the output voltage is lower than a threshold, the voltage detector outputs the detection result having the switch control circuit generate the first switch control signal and the second switch control signal suitable for the asynchronous mode.

3. The voltage converter of claim 2, wherein in a second circumstance that the voltage detector determines that the difference between the input voltage and the output voltage is higher than the threshold, the voltage detector outputs the detection result having the switch control circuit generate the first switch control signal and the second switch control signal suitable for the synchronous mode.

4. The voltage converter of claim 1, wherein in a circumstance that the voltage detector determines that a difference between the input voltage and the output voltage is higher than a threshold, the voltage detector outputs the detection result having the switch control circuit generate the first switch control signal and the second switch control signal suitable for the synchronous mode.

5. The voltage converter of claim 1, wherein the voltage detector is an analog-to-digital converter.

6. The voltage converter of claim 1, wherein the voltage detector is a voltage comparator.

7. The voltage converter of claim 6, wherein the voltage comparator is configured to compare the input voltage with a reference voltage related to the output voltage.

8. The voltage converter of claim 1, wherein the switch control circuit is configured to execute at least one of a pulse width modulation (PWM) and a pulse frequency modulation (PFM).

9. The voltage converter of claim 1, wherein each of the first switch and the second switch is a transistor, the second switch includes a parasitic diode, and the parasitic diode functions as a current path conducting current in the asynchronous mode.

10. The voltage converter of claim 9, wherein the first switch is a first-type transistor and the second switch is a second-type transistor.

11. The voltage converter of claim 1, wherein the energy storage circuit includes an inductor and a capacitor, the inductor is set between the input terminal and the output terminal, and the capacitor is set between the output terminal and a low-voltage terminal.

12. The voltage converter of claim 11, wherein the voltage converter is a buck converter, the first switch is set between the input terminal and a node, the second switch is set between the node and the low-voltage terminal, and the inductor is set between the node and the output terminal.

13. The voltage converter of claim 11, wherein the voltage converter is a boost converter, the inductor is set between the input terminal and a node, the first switch is set between the node and the low-voltage terminal, and the second switch is set between the node and the output terminal.

14. The voltage converter of claim 1, wherein the first switch is directly coupled to the input terminal, and the second switch is directly coupled to a ground terminal.

* * * * *